(12) United States Patent
Malmirchegini et al.

(10) Patent No.: US 9,264,073 B2
(45) Date of Patent: Feb. 16, 2016

(54) FREEZING-BASED LDPC DECODER AND METHOD

(75) Inventors: Mehrzad Malmirchegini, Albuquerque, NM (US); Shadi Abu-surra, Richardson, TX (US); Thomas M. Henige, Plano, TX (US); Eran Pisek, Plano, TX (US)

(73) Assignee: Samsung Electronics Co., Ltd, Suwon-Si (KR)

( * ) Notice: Subject to any disclaimer, the term of this patent is extended or adjusted under 35 U.S.C. 154(b) by 103 days.

(21) Appl. No.: 13/595,846

(22) Filed: Aug. 27, 2012

(65) Prior Publication Data

US 2013/0061114 A1 Mar. 7, 2013

Related U.S. Application Data

(60) Provisional application No. 61/530,758, filed on Sep. 2, 2011.

(51) Int. Cl.
*H03M 13/05* (2006.01)
*G06F 11/10* (2006.01)
*H03M 13/11* (2006.01)
*H03M 13/00* (2006.01)
*H03M 13/31* (2006.01)

(52) U.S. Cl.
CPC .......... *H03M 13/116* (2013.01); *H03M 13/114* (2013.01); *H03M 13/118* (2013.01); *H03M 13/1117* (2013.01); *H03M 13/1137* (2013.01); *H03M 13/6544* (2013.01); *H03M 13/6577* (2013.01); *H03M 13/6591* (2013.01); *G06F 11/1008* (2013.01); *H03M 13/1165* (2013.01); *H03M 13/31* (2013.01)

(58) Field of Classification Search
CPC ............ G06F 11/1076; G06F 11/1008; G06F 11/1004; G06F 11/1068; G06F 11/1044; G06F 11/1072; H03M 13/1102–13/1197
USPC .......................... 714/763, 752, 746, E11.034
See application file for complete search history.

(56) References Cited

U.S. PATENT DOCUMENTS 8,291,292 B1 * 10/2012 Varnica et al. ................. 714/758
8,601,352 B1 * 12/2013 Anholt et al. .................. 714/790
2008/0276156 A1 * 11/2008 Gunnam et al. ............... 714/801

* cited by examiner

*Primary Examiner* — Albert Decady
*Assistant Examiner* — Christian Dorman

(57) ABSTRACT

A low-density parity check (LDPC) decoder includes a memory configured to store multiple variable node LLR values in a LLR memory and multiple check nodes messages in a CN memory. The LDPC decoder also includes a saturation indicator configured to determine whether each check node of the H-matrix becomes saturated, and a multiplexer. The multiplexer is configured store an extrinsic check node value in the CN memory and updated LLR value in the LLR memory when the variable node is not saturated; and store a freeze input value in the CN memory and a freeze value in the LLR memory when the variable node is saturated.

20 Claims, 5 Drawing Sheets

FREEZING-BASED LDPC DECODER AND METHOD

CROSS-REFERENCE TO RELATED APPLICATION(S) AND CLAIM OF PRIORITY

The present application is related to U.S. Provisional Patent Application No. 61/530,758, filed Sep. 2, 2011, entitled "FREEZING-BASED SCHEME FOR THE FIXED-POINT IMPLEMENTATION OF MIN-SUM LDPC DECODING". Provisional Patent Application No. 61/530,758 is assigned to the assignee of the present application and is hereby incorporated by reference into the present application as if fully set forth herein. The present application hereby claims priority under 35 U.S.C. §119(e) to U.S. Provisional Patent Application No. 61/530,758.

TECHNICAL FIELD

The present application relates generally to encoding devices, and more particularly, to a freezing-based LDPC decoder and method.

BACKGROUND

Low density parity check (LDPC) codes are channel codes used in forward error correcting (FEC) schemes. LDPC codes are well known for their good performance. Moreover, their structure is suitable for parallel decoding, which makes them suitable for relatively fast decoding. The ability to provide fast decoding can be particularly useful for today's high speed communication networks that are currently being deployed. Consequently, many of the currently active telecommunication standards have LDPC codes in their physical layer FEC scheme, such as the Institute of Electrical and Electronics Engineers (IEEE) 802.16e standard, IEEE 802.15c standard, and Digital Video Broadcasting—Satellite—Second Generation (DVB-S2) standard.

SUMMARY

According to one embodiment, a low-density parity check (LDPC) decoder includes a memory configured to store multiple variable node LLR values and multiple check nodes messages, a saturation indicator configured to determine whether each check node of the H-matrix becomes saturated, and a multiplexer. The multiplexer is configured to store an extrinsic check node value in the memory when the value in the LLR memory is not saturated, and store a freeze input value in the check node memory when the value in the LLR memory is saturated. Also, the saturation indicator, once set, prevents further updating of the check node in the LLR memory.

According to another embodiment, a low-density parity check (LDPC) decoding method includes storing multiple variable node LLR values and multiple check nodes messages, and determining whether each check node of the H-matrix becomes saturated. The method can then store an extrinsic value in the LLR memory when the previous value in the LLR memory is not saturated, and freeze the value in the LLR memory and store a freeze input value in the check node memory when the value in the LLR memory is saturated.

According to another embodiment, code implemented on a non-transitory computer-readable medium is configured to, when executed by a processor, store multiple variable nodes LLR values and check nodes messages, determine whether each LLR value becomes saturated. The code can then store an extrinsic check node value in the LLR memory when the previous value in the LLR memory is not saturated, and freeze the value in the LLR memory and store a freeze input value in the check node memory when the value in the LLR memory is saturated.

Before undertaking the DETAILED DESCRIPTION below, it can be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, can mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device can be implemented in hardware, firmware or software, or some combination of at least two of the same. It should be noted that the functionality associated with any particular controller can be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure can be implemented in any suitably arranged wireless or wireline communication system.

Figure 1:
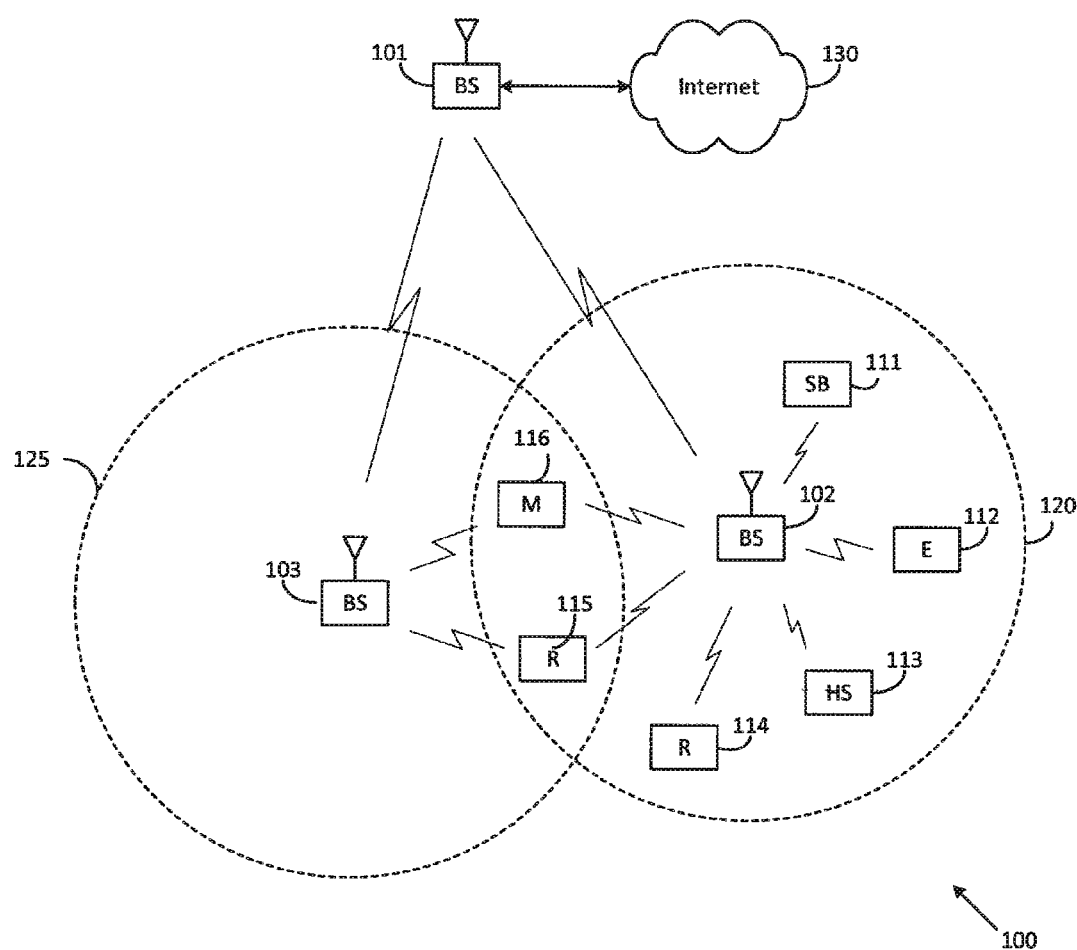
FIG. 1 illustrates a wireless network that performs LDPC encoding and decoding according to the embodiments of the present disclosure.

FIG. 1 illustrates a wireless network 100 that performs an LDPC encoding and decoding process according to the embodiments of the present disclosure. The wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of mobile stations within coverage area 120 of base station 102. The first plurality of mobile stations includes mobile station 111, which may be located in a small business (SB), mobile station 112, which may be located in an enterprise (E), mobile station 113, which may be located in a WiFi hotspot (HS), mobile station 114, which may be located in a first residence (R), mobile station 115, which may be located in a second residence (R), and mobile station 116, which may be a mobile device (M), such as a cell phone, a wireless laptop, a wireless PDA, or the like.

Base station 103 provides wireless broadband access (via base station 101) to Internet 130 to a second plurality of mobile stations within coverage area 125 of base station 103. The second plurality of mobile stations includes mobile station 115 and mobile station 116. In an exemplary embodiment, base stations 101-103 communicate with each other and with mobile stations 111-116 using OFDM or OFDMA techniques.

Base station 101 can be in communication with either a greater number or a lesser number of base stations. Furthermore, while only six mobile stations are depicted in FIG. 1, it is understood that wireless network 100 can provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and can be said to be operating in handoff mode, as known to those of skill in the art.

Mobile stations 111-116 access voice, data, video, video conferencing, and/or other broadband services via Internet 130. In an exemplary embodiment, one or more of mobile stations 111-116 is associated with an access point (AP) of a WiFi WLAN. Mobile station 116 can be any of a number of mobile devices, including a wireless-enabled laptop computer, personal data assistant, notebook, handheld device, or other wireless-enabled device. Mobile stations 114 and 115 can be, for example, a wireless-enabled personal computer (PC), a laptop computer, a gateway, or another device.

Figure 2A:
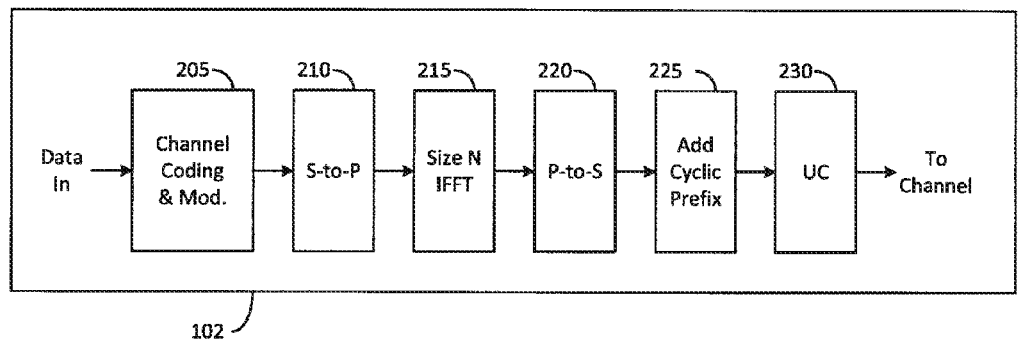
FIGS. 2A and 2B illustrate an orthogonal frequency division multiple access (OFDMA) transmit path and receive path, respectively, according to embodiments of the present disclosure.
Figure 2B:
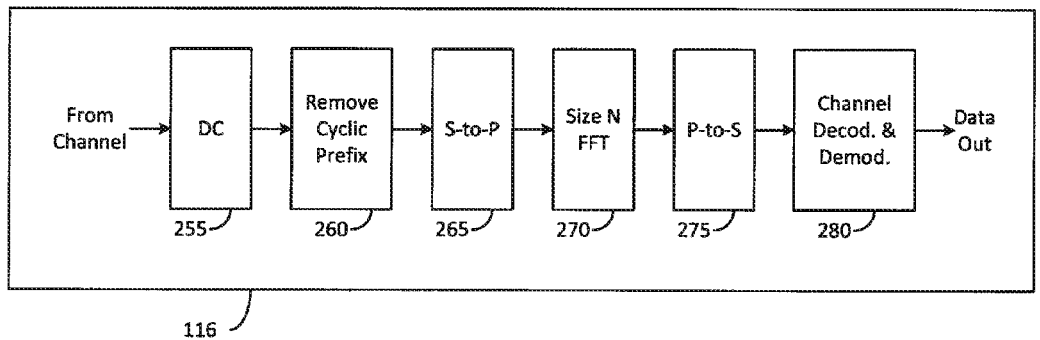

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in mobile station (MS) 116 for the purposes of illustration and explanation only. However, it will be understood by those skilled in the art that the OFDMA receive path also can be implemented in BS 102 and the OFDMA transmit path can be implemented in MS 116.

The transmit path in BS 102 includes channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in MS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B can be implemented in software while other components can be implemented by configurable hardware or a mixture of software and configurable hardware. In particular, it is noted that the FFT blocks and the IFFT blocks described in this disclosure document can be implemented as configurable software algorithms, where the value of Size N can be modified according to the implementation.

In BS 102, channel coding and modulation block 205 receives a set of information bits, applies LDPC coding and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and MS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal can also be filtered at baseband before conversion to RF frequency.

The transmitted RF signal arrives at MS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes (i.e., performs LDPC decoding) the modulated symbols to recover the original input data stream.

Each of base stations 101-103 implement a transmit path that is analogous to transmitting in the downlink to mobile stations 111-116 and implement a receive path that is analogous to receiving in the uplink from mobile stations 111-116. Similarly, each one of mobile stations 111-116 implement a transmit path corresponding to the architecture for transmitting in the uplink to base stations 101-103 and implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more context-based operation reconfigurable instruction set processors (CRISPs), such as the CRISP processor(s) described in one or more of application Ser. No. 11/123,313, filed May 6, 2005 and entitled "Context-Based Operation Reconfigurable Instruction Set Processor And Method Of Operation"; U.S. Pat. No. 7,769,912, filed Jun. 1, 2005 and entitled "MultiStandard SDR Architecture Using Context-Based Operation Reconfigurable Instruction Set Processors"; U.S. Pat. No. 7,483,933, issued Jan. 27, 2009 and entitled "Correlation Architecture For Use In Software-Defined Radio Systems"; application Ser. No. 11/225,479, filed Sep. 13, 2005 and entitled "Turbo Code Decoder Architecture For Use In Software-Defined Radio Systems"; and application Ser. No. 11/501,577, filed Aug. 9, 2006 and entitled "Multi-Code Correlation Architecture For Use In Software-Defined Radio Systems", all of which are hereby incorporated by reference into the present application as if fully set forth herein.

Figure 3:
FIG. 3 illustrates a parity check H-matrix associated with an LDPC encoding scheme according to embodiments of the present disclosure.

FIG. 3 illustrates a parity check H-matrix associated with a LDPC encoding scheme according to embodiments of the present disclosure. The embodiment of the H-matrix 300 shown in FIG. 3 is for illustration only. Other embodiments could be used without departing from the scope of this disclosure.

The H-matrix 300 as shown is a ½ code rate H-matrix conforming to the WiGig standard. In other embodiments, the H-matrix can have any suitable rate, such as a ⅝, ¾, or a 13/16 code rate. Additionally, the H-matrix 300 shown has a block size (N) of 672 bits with a lifting factor (Z) of 42. Other embodiments of H-matrices for use with the present disclosure can have other block sizes and lifting (Z) factors.

The rate ½ H-matrix 300 is a 672×336 matrix that represents a transmission of 672 bits per frame (bpf). In the H-matrix 300, the first eight columns 302 represent systematic (or data) bits while the second eight columns 304 represent parity (or redundancy) bits. Each bit is a location bit that represents a 42×42 matrix. The Z-factor defines the number of bits per matrix.

For example, the Z-Factor as shown is set to '42'. As such, using the H-matrix shown, each frame in the transmission includes 336 systematic bits and 336 parity bits. A '−1' value represents a zero matrix. Accordingly, the '−1' value indicates that the location is not used in the calculation. The remaining values (i.e., those having values other than '−1') are location values that represent a matrix.

Each row in the H-matrix 300 form a layer, which consists of '42' contention free check nodes, and so they can be processed in parallel without contention. An iteration (computing VN-to-CN messages, CN-to-VN messages, and updating VNs LLR values), in a layered decoder, consists of several sub-iterations. One sub-iteration per layer, where all check nodes in the layer are updated in parallel.

Figure 4:
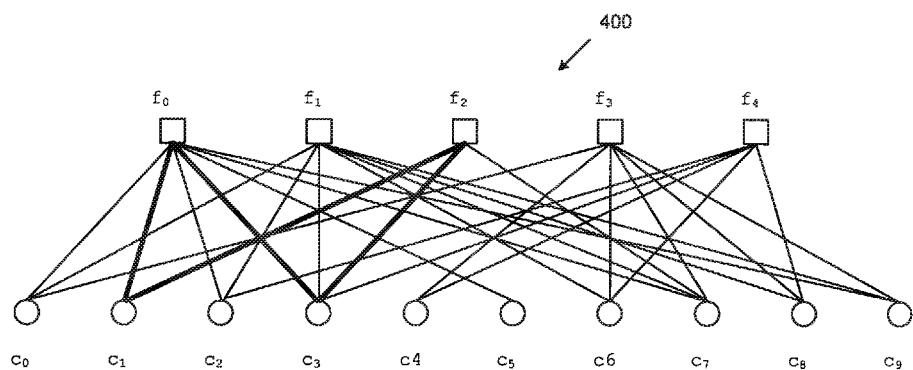
FIG. 4 illustrates a tanner graph that corresponds to a parity check matrix according to embodiments of the present disclosure.

FIG. 4 illustrates Tanner graph 400, which corresponds to a parity check matrix, according to embodiments of the present disclosure. The embodiment of Tanner graph 400 shown in FIG. 4 is for illustration only. Other embodiments of Tanner graph 400 can be used without departing from the scope of this disclosure.

Tanner graph 400 is a bipartite graph. In bipartite graphs, nodes are separated into two distinctive sets and edges only connect nodes of two different types. The two types of nodes in Tanner graph 400 are referred to as variable nodes (hereafter, "v-nodes") and check nodes (hereafter, "c-nodes").

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

Tanner graph 400 corresponds to the parity check H-matrix illustrated by Equation 1. Tanner graph 400 includes five (5) c-nodes (the number of parity bits) and ten (10) v-nodes (the number of bits in a codeword). C-node fi is connected to v-node $c_j$ if the element $h_{ij}$ of H-matrix is a binary 1. For example, c-node f0 is connected $c_0$, $c_1$, $c_2$, $c_3$, $c_5$, $c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 1:

$$\vec{H}_0 = [1111010101]$$ [Eqn. 1]

A degree of a node is the number of edges (e.g., connections) connected to the node.

Low Density Parity Check codes (LDPC) have recently received considerable attention in the error control coding field, due to the low complexity in implementation of decoding algorithms. Furthermore, this class of codes performs near the Shannon bound for relatively long block lengths. Among different families of decoding algorithms, the well-known belief propagation (BP) algorithm provides a good decoding performance. However, the BP algorithm often requires large hardware complexity. A simplified variation of BP algorithm, referred to as a min-sum decoding algorithm, reduces the hardware complexity, but often at the cost of performance degradation. Recently, a normalized min-sum decoding algorithm has been implemented in many practical and finite precision applications since it provides acceptable decoding performance as compared to BP algorithm for regular codes. However, for the most irregular LDPC codes, the normalized min-sum decoding algorithm may perform relatively poorly under finite precision implementation conditions.

Most irregular LDPC codes typically have a large amount of low-degree variable nodes. These variable nodes require more numbers of iterations to converge as compared to high-degree variables nodes. Furthermore, finite precision decoding techniques further decreases the convergence rate of the low-degree variable nodes due to quantization effects. Various min-sum algorithms have been proposed to improve the decoding performance, but at the cost of slower convergence rate and higher hardware complexity. For instance, it has been proposed that the variable nodes can use down-scaled intrinsic information iteratively to improve the reliability of extrinsic information at the variable nodes. The down-scaling in intrinsic values, however, may reduce the convergence speed. Furthermore, the down scaling factor often needs to be optimized for a specific number of iterations.

Figure 5:
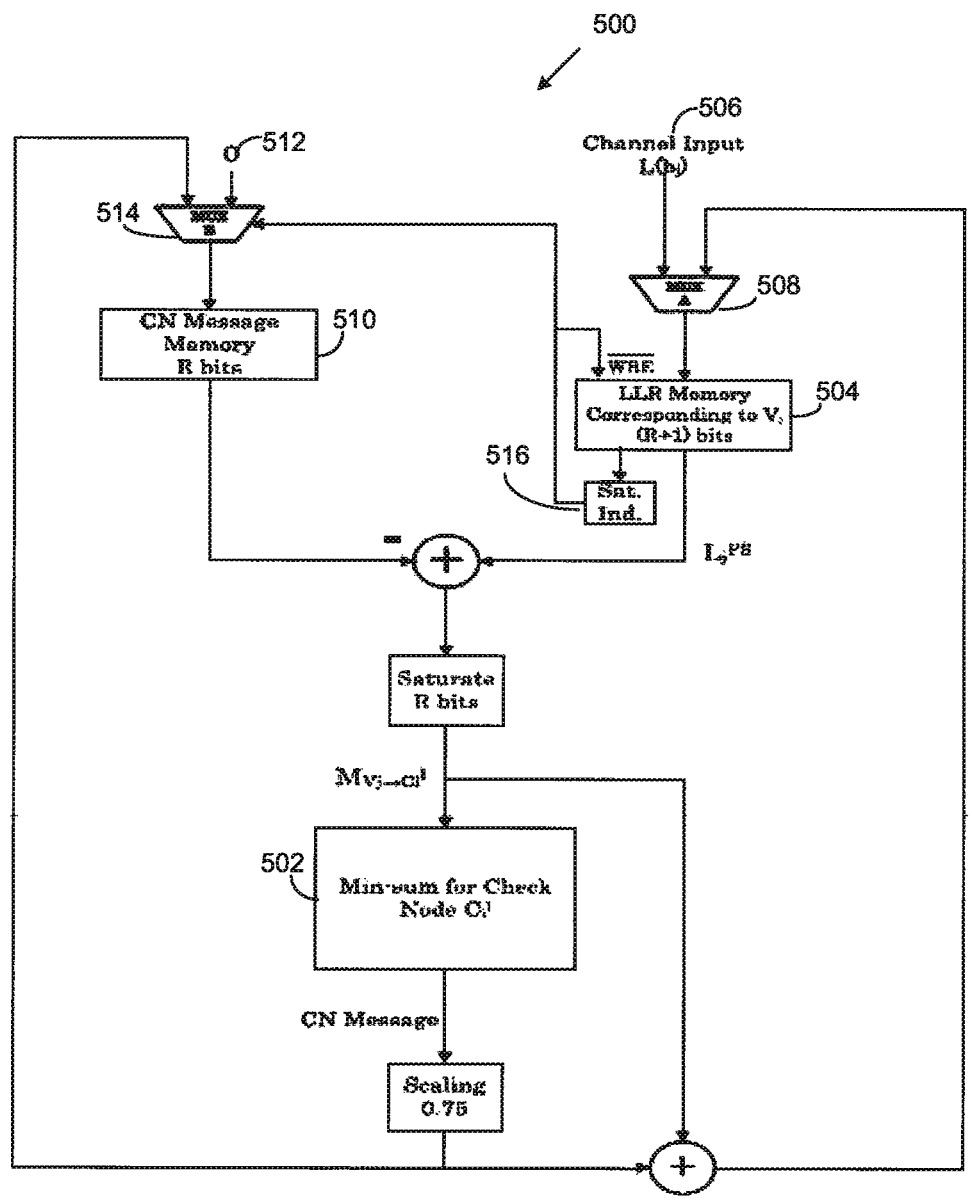
FIG. 5 illustrates a freezing-based LDPC decoder according to embodiments of the present disclosure.

FIG. 5 illustrates an example freezing-based LDPC decoder 500 according to embodiments of the present disclosure. The embodiment of the freezing-based LDPC decoder 500 shown in FIG. 5 is for illustration only. Other embodiments could be used without departing from the scope of this disclosure.

The freezing-based LDPC decoder 500 includes a min-sum processing block 502 that generates check nodes values during each iteration of a parity check H-matrix. The freezing-based LDPC decoder 500 includes a LLR memory 504 that stores check node values associated with either the output of a LLR process inputted from input 506 or from iterated check node values obtained from a previous iteration as determined by a first multiplexer 508, or will not be updated (freeze its value, or set to a freeze value) if the saturation indicator 516 is set. The freezing-based LDPC decoder 500 also includes a check node memory 510 that stores either extrinsic check node values generated by the min-sum processing block 502 or frozen value, if the saturation indicator 516 is set, as determined by a second multiplexer 514.

According to the teachings of the present disclosure, a saturation indicator 516 is also included that determines when each check node becomes saturated. If a particular check node becomes saturated, saturation indicator 516 causes multiplexer 514 to become switched such that further values from the min-sum processing block 502 are replaced by a freeze input value obtained from the input 512.

As the number of iterations of a LDPC decoding process increases, the LLR values increase toward a statistical limit. However, due to saturation, these values should be restricted from exceeding an allowable range. In such cases, the saturated LLR values revert away from the statistical limit, which is not desirable. In order to overcome this problem, the posterior LLR values can be frozen as they reach the upper and lower saturation regions. Let $I_j^l(k)$ denote the saturation indicator of the posterior LLR values corresponding to the $j^{th}$ variable node at time k and layer l ($1 \leq l \leq M$). Assuming a fixed-point decoder with R-bits precision, then $I_j^l(k) = F_R(L_j^{ps,l}(k))$, according to Equation 2.

$$F_R(z) = \begin{cases} 0, & -2^{R-1} < z < 2^{R-1} - 1; \\ 1, & \text{otherwise.} \end{cases} \quad [\text{Eqn. 2}]$$

If a saturation function is defined as in Equation 3

$$S_R(z) \triangleq \begin{cases} -2^{R-1}, & z \leq -2^{R-1}; \\ z, & -2^{R-1} < z < 2^{R-1} - 1; \\ 2^{R-1} - 1, & z \geq 2^{R-1} - 1. \end{cases} \quad [\text{Eqn. 3}]$$

for $z \in \mathbb{Z}$ (integer). A fixed-point and freezing-based Min-Sum decoding algorithm can be summarized as follows:

Initialization: For k=0, the check-to-variable messages are initialized to zero. Furthermore, $L_j^{ps,0}(0) = Q^{R+1,\Delta_{opt}}(L_j^{pr})$, where $$Q^{q,\Delta}(x) \triangleq \begin{cases} (2^{q-1}-1)\Delta, & x \geq \frac{2^q - 3}{2}\Delta; \\ \left\lfloor \frac{x}{\Delta} + \frac{1}{2} \right\rfloor \Delta, & -\frac{2^q - 1}{2}\Delta < x < \frac{2^q - 3}{d}\Delta; \\ -2^{q-1}\Delta, & x \leq -\frac{2^q - 1}{2}\Delta. \end{cases}$$

and $I_j^l(0) = 0$ for $1 \leq j \leq NZ$.

At iteration k and layer l: The variable nodes compute the corresponding message to each of their neighbors in the $l^{th}$ layer as shown in Equation 4.

$$\rho_{v_j \to c_i^l}(k) = \begin{cases} S_R\left(L_j^{ps,l-1}(k) - \rho_{c_i^l \to v_j}(k-1)\right), & I_j^l(k) = 0; \\ S_R\left(L_j^{ps,l-1}(k)\right), & I_j^l(k) = 1. \end{cases} \quad [\text{Eqn. 4}]$$

For $i \in \mathcal{N}_{c_i^l}$ and $1 \leq i \leq Z$. We also have $L_j^{ps,0}(k) = L_j^{ps,M}(k-1)$.

Each check node will then send the following value to its VN neighbors as shown in Equation 5

$$\rho_{c_i^l \to v_j}(k) = \begin{cases} S_R\left(\frac{\varepsilon_{c_i^l,v_j}(k)}{\alpha} | \rho_{v_{m_i^l(k)} \to c_i^l}(k)|\right), & j \neq m_i^l(k); \\ S_R\left(\frac{\varepsilon_{c_i^l,v_j}(k)}{\alpha} | \rho_{v_{n_i^l(k)} \to c_i^l}(k)|\right), & j = m_i^l(k). \end{cases} \quad [\text{Eqn. 5}]$$

where $m_i^l(k)$, $n_i^l(k)$, and $\varepsilon_{c_i^l,v_j}(k)$ are defined as follows:

$$m_i^l(k) \triangleq \arg\min_{p \in \mathcal{N}_{c_i^l}} |\rho_{v_p \to c_i^l}(k)|,$$

$$n_i^l(k) \triangleq \arg\min_{p \in \mathcal{N}_{c_i^l} \setminus m_i^l(k)} |\rho_{v_p \to c_i^l}(k)|,$$

$$\varepsilon_{c_i^l,v_j}(k) = \Pi_{p \in \mathcal{N}_{c_i^l} \setminus \{j\}} \text{sgn}\left(\rho_{v_p \to c_i^l}(k)\right).$$

The posterior LLR value is updated as shown in Equation 7.

$$L_j^{ps,l}(k) = \begin{cases} \rho_{v_j \to c_i^l}(k) + \rho_{c_i^l \to v_j}(k), & I_j^l(k) = 0; \\ L_j^{ps,l-1}(k), & I_j^l(k) = 1. \end{cases} \quad [\text{Eqn. 7}]$$

Hard decisions are then made based on the sign of the posterior LLR values. The syndrome of the codeword is then checked in order to detect decoding error.

The freeze value is set to be any suitable value. In one embodiment, the freeze value is set to the last LLR value that was obtained for that particular variable node prior to becoming saturated.

In another embodiment, the freeze value is set to the maximum or minimum value of the probability-messages scale used in the min-sum process. For example, with a check node structure using a 8-bit fixed length probability that spans from a '−128' value (e.g., logic '1') to a '+127' value (e.g., logic '0'), the freeze value is to either the value '−128' value or '+127' value when the check node value becomes saturated toward logic '1' or logic '0', respectively.

In another embodiment, the freeze value is set to a median between the maximum/minimum value of the probability-messages scale and a center point of the probability-messages scale. For example, with a check node structure using the 8-bit fixed length probability that spans from a '−128' value to a '+127' value as described above, the freeze value is at, or near to, a '−63' value, and at a '+63' value for a decoded logic '1' or logic '0', respectively. Other embodiments include any desired value to be the freeze value.

Certain embodiments incorporating freeze values at, or close to the median value or the last LLR value that was obtained for that particular variable node prior to becoming saturated provide an advantage in that additional min-sum operations performed on other variable nodes in the H-matrix would not introduced noise due to modification of the frozen variable nodes' LLR values.

In the particular embodiment shown, the check node operations occur in R bits, while the variable nodes use R+1 bits. The particular embodiment shown only uses one saturation unit, which reduces the implementation complexity in certain embodiments. Other embodiments use any quantity of saturation units.

In a related embodiment, though the LLR memory 504 is R+1 bits, the channel input 506 can be clipped to a lower precision than R+1 bits (e.g., R bits).

As described above, the saturation indicator 516 is used to monitor the saturation status of each variable node. In order to decrease the number of required bits, this bit is generated from the stored LLR values using known logic circuits. The saturation indicator 516 activates the writing disable switch of the $j^{th}$ variable node. Furthermore, the freeze input 512 is activated when the extrinsic check node value is in the saturation region. Also, in variation of this embodiment the multiplexing unit 514 can be removed and the CN message be saved all the times in the CN memory regardless of the saturation indicator.

The freeze value is introduced at any suitable point in the decoder 500. In one embodiment, the multiplexer 514 is coupled between the min-sum processing block 502 and CN memory unit 510; therefore, it is not within the main processing loop of the decoder 500. The processing loop of the decoder 500 generally refers to the iterative (e.g., repeating) cycle that includes the LLR processing portion, which is stored in LLR memory 504, and the min-sum processing block 502. By configuring the multiplexer 514 and freeze input 512 outside the processing loop, potential performance issues associated with additional processing steps required for each iteration are avoided in some embodiments. Although the use of saturation indicator 516, multiplexer 510, and freeze input 512 chain can add a one time-step delay according to equation 3 where $I_j^i(k)=1$, a relatively negligible performance loss relative to a conventional decoder design can be incurred.

Although FIG. 5 illustrates one example decoder 500, various changes can be made to FIG. 5. For example, the multiplexer 514 that either stores an extrinsic check node value or the freeze input value can be configured in the decoder at any point along the main processing loop. Nevertheless, the configuration as shown provides a particular advantage in that additional processing iterations are not required within the loop.

Figure 6:
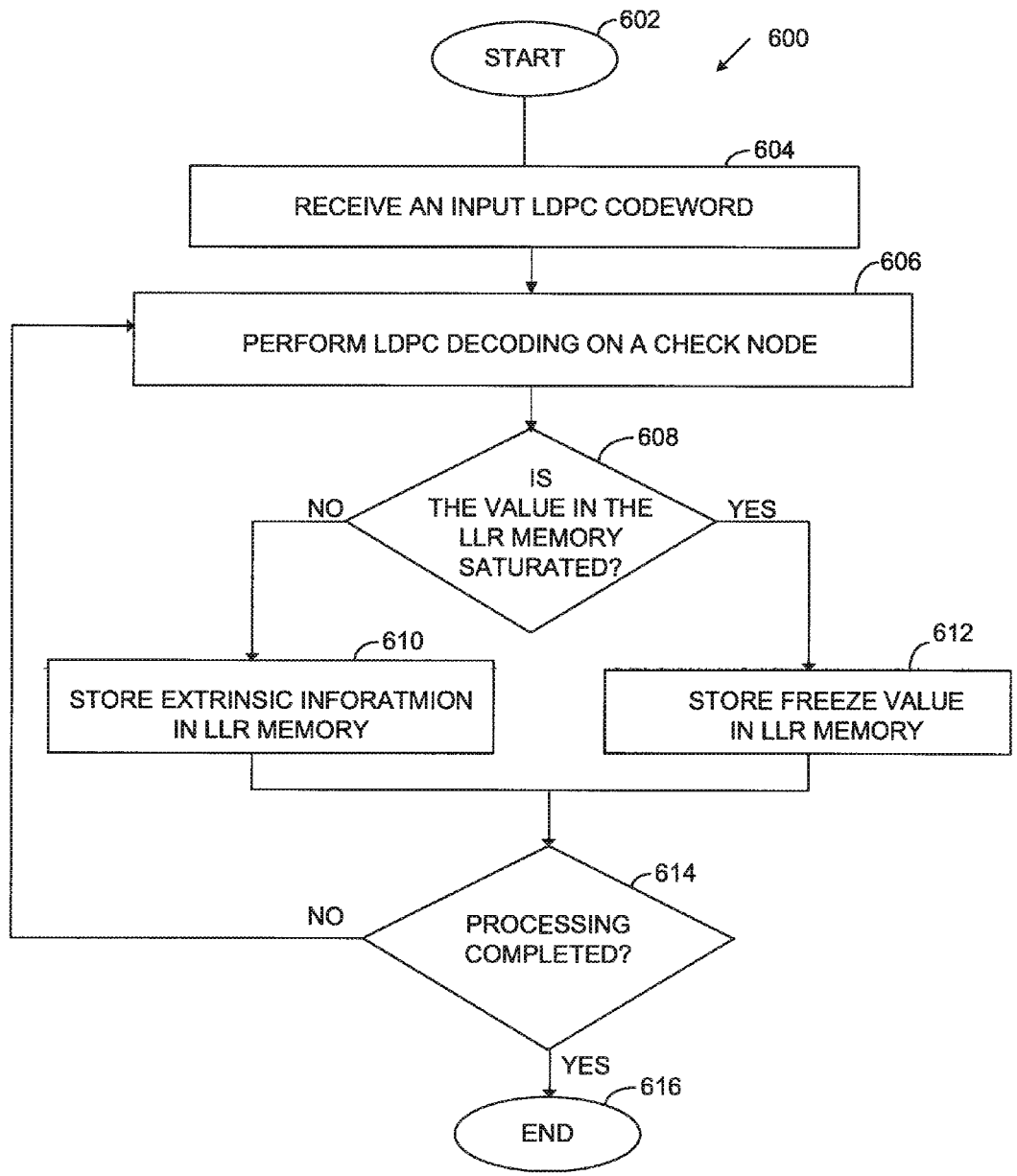
FIG. 6 illustrates a freezing-based LDPC decoding process according to embodiments of the present disclosure.

FIG. 6 illustrates an example freezing-based LDPC decoding process 600 according to embodiments of the present disclosure. The embodiment of the freezing-based LDPC decoding process 600 shown in FIG. 6 is for illustration only. Other embodiments could be used without departing from the scope of this disclosure. In step 602, the process is initiated.

In step 604, the freezing-based LDPC decoder receives a LDPC codeword comprising a parity check H-matrix encoded according to a LDPC encoding technique. The H-matrix can be any type having multiple Z-grouped rows, such as those conforming to the WiGig standard.

In step 606, the freezing-based LDPC decoder performs LDPC decoding on a variable node in the codeword. Next, the freezing-based LDPC decoder determines whether the variable node on which LDPC decoding was performed in step 606 is saturated in step 608. The saturation of the check node is determined by comparing a value of the variable node against a threshold value. For example, upper and lower threshold values of '127' and '−128' are used for a variable node having 8-bit check resolution. Additionally, these threshold values are adjusted on an as needed basis.

If the freezing-based LDPC decoder determines that the variable node is not saturated, processing continues at step 610 in which the decoded variable node is stored in the corresponding LLR memory. However, if the variable node is determined to be saturated, processing continues at step 612 in which a freeze value is stored in the corresponding LLR memory. The freeze input value can be any suitable type. For example, the freeze value can be set to the last LLR value that was obtained for that particular check node prior to becoming saturated. For another example, the freeze value can be set to the maximum or minimum value of the probability-messages scale used in the min-sum process. For yet another example, the freeze value can be set to a median between the maximum/minimum value of the probability-messages scale and a center point of the probability scale. In addition, a freeze input value can be stored in the CN memory 510 if the saturation indicator is set.

At step 614, if additional check nodes are to be decoded, processing reverts back to step 606 to perform LDPC decoding on another check node of the LDPC codeword. However, if no further check nodes are to be decoded, processing ends at step 616.

The decoding of the LDPC codeword can be halted for various reasons. For example, LDPC decoding of the LDPC codeword is considered to be completed after a fixed quantity of iterations.

For another example, LDPC decoding of the LDPC codeword is considered to be completed after a specified statistical distribution of check node values are achieved.

Although FIG. 6 illustrates one example of a method 600 for decoding a LDPC codeword using a freeze input, various changes can be made to FIG. 6. For example, although described as iterating through the codeword with one check node at a time, other embodiments iterate multiple check nodes at a time, such as by decoding an entire row of check nodes of the H-matrix as shown above in FIG. 4.

Although the present disclosure has been described with an exemplary embodiment, various changes and modifications can be suggested to one skilled in the art. It is intended that the present disclosure encompass such changes and modifications as fall within the scope of the appended claims.

What is claimed is:

1. A low-density parity check (LDPC) decoder comprising:
    a log of Likelihood ratio (LLR) memory configured to store a plurality of variable node LLR values and a plurality of check nodes messages;
    a saturation indicator configured to determine whether each variable node of an H-matrix becomes saturated;
    a multiplexer configured to:
        store an extrinsic check node value in a CN memory and updated LLR values in the LLR memory when the variable node is not saturated; and
        store a freeze input value in the CN memory and a freeze value in the LLR memory when the variable node is saturated; and
    a check node processing block configured to receive a function of outputs from the CN memory and the LLR memory and to generate the extrinsic check node value when the variable node is either saturated or not saturated.

2. The LDPC decoder of claim 1, wherein the freeze input value comprises a last LLR value that was obtained for that particular variable node prior to becoming saturated.

3. The LDPC decoder of claim 1, wherein the freeze input value comprises a maximum or minimum value of a probability-messages scale used in a min-sum process in the check node processing block.

4. The LDPC decoder of claim 1, wherein the freeze input value comprises a median between a maximum/minimum value of the probability-messages scale and a center point of the probability-messages scale.

5. The LDPC decoder of claim 1, wherein the multiplexer comprises:
    a first multiplexer configured to: store the updated LLR values in the LLR memory when the variable node is not saturated, and store the freeze value in the LLR memory when the variable node is saturated; and
    a second multiplexer configured outside of a main processing loop of the decoder and disposed to receive the extrinsic check node value from a min-sum process in the check node processing block and the freeze input value, the second multiplexer configured to, in response to receiving an indication from the saturation indicator:

store the extrinsic check node value in the CN memory when the variable node is not saturated, and store the freeze input value in the CN memory when the variable node is saturated, the freeze input value inputted to the second multiplexer, wherein the main processing loop includes LLR processing, the LLR memory, and the check node processing block.

6. The LDPC decoder of claim 1, wherein the saturation indicator is configured to determine whether each check node is saturated by comparing the check node value against a threshold value.

7. The LDPC decoder of claim 6, wherein the threshold value is adjustable.

8. A low-density parity check (LDPC) decoding method comprising:
storing a plurality of variable node LLR values in a LLR memory and a plurality of Check nodes messages in a CN memory;
determining whether each variable node of an H-matrix becomes saturated;
storing an extrinsic check node value in a CN memory and an updated LLR value in the LLR memory when the variable node is not saturated;
storing a freeze input value in the CN memory and a freeze value in the LLR memory when the variable node is saturated; and
generating, by a check node processing block configured to receive a function of outputs from the CN memory and the LLR memory, the extrinsic check node value when the variable node is either saturated or not saturated.

9. The LDPC method of claim 8, wherein the freeze input value comprises a last LLR value that was obtained for that particular variable node prior to becoming saturated.

10. The LDPC method of claim 8, wherein the freeze input value comprises a maximum or minimum value of a probability scale used in a min-sum process.

11. The LDPC method of claim 8, wherein the freeze input value comprises a median between the maximum/minimum value of the probability-messages scale and a center point of the probability-messages scale.

12. The LDPC method of claim 8, wherein the storing of the extrinsic check node value or the freeze input value is performed outside of a main processing loop of the decoder and between the CN memory and a min-sum process in the check node processing block.

13. The LDPC method of claim 8, further comprising determining whether each check node is saturated by comparing the check node value against a threshold value.

14. The LDPC method of claim 13, wherein the threshold value is adjustable.

15. A non-transitory computer readable medium embodying a computer program, the computer program comprising computer readable program code that, when executed by a processor, causes the processor to:
store a plurality of variable node LLR values in a LLR memory and a plurality of check nodes messages in a CN memory;
determine whether each variable node of an H-matrix becomes saturated;
store an extrinsic check node value in the CN memory and updated LLR value in the LLR memory when the variable node is not saturated;
store a freeze input value in the CN memory and a freeze value in the LLR memory when the variable node is saturated; and
generate, by a check node processing block configured to receive a function of outputs from the CN memory and the LLR memory, the extrinsic check node value when the variable node is either saturated or not saturated.

16. The non-transitory computer readable medium of claim 15, wherein the freeze input value comprises a last LLR value that was obtained for that particular variable node prior to becoming saturated.

17. The non-transitory computer readable medium of claim 15, wherein the freeze input value comprises a maximum or minimum value of a probability-messages scale used in a min-sum process in the check node processing block.

18. The non-transitory computer readable medium of claim 15, wherein the freeze input value comprises a median between the maximum/minimum value of the probability-messages scale and a center point of the probability-messages scale.

19. The non-transitory computer readable medium of claim 15, wherein the computer program further comprises computer readable program code that, when executed by the processor, causes the processor to perform the storing of the extrinsic check node value or the freeze input value outside of a main processing loop of the decoder and between the CN memory and a min-sum process in the check node processing block.

20. The non-transitory computer readable medium of claim 15, wherein the computer program further comprises computer readable program code that, when executed by the processor, causes the processor to determine whether each variable node is saturated by comparing the check node value against a threshold value.

* * * * *